United States Patent
Liu et al.

(10) Patent No.: US 10,785,851 B2
(45) Date of Patent: Sep. 22, 2020

(54) LIGHT SOURCE AND LIGHTING DEVICE

(71) Applicant: BOE TECHNOLOGY GROUP CO., LTD., Beijing (CN)

(72) Inventors: Fang Liu, Beijing (CN); Hanyan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/066,785

(22) PCT Filed: Nov. 29, 2017

(86) PCT No.: PCT/CN2017/113639
§ 371 (c)(1),
(2) Date: Jun. 28, 2018

(87) PCT Pub. No.: WO2018/196374
PCT Pub. Date: Nov. 1, 2018

(65) Prior Publication Data
US 2019/0281683 A1    Sep. 12, 2019

(30) Foreign Application Priority Data

Apr. 24, 2017 (CN) .......................... 2017 1 0272056

(51) Int. Cl.
| H05B 47/11 | (2020.01) |
| H01L 33/38 | (2010.01) |
| G02F 1/01  | (2006.01) |
| H01L 33/58 | (2010.01) |

(52) U.S. Cl.
CPC .............. *H05B 47/11* (2020.01); *G02F 1/01* (2013.01); *H01L 33/38* (2013.01); *H01L 33/58* (2013.01)

(58) Field of Classification Search
CPC ........... H05B 47/11; H05B 45/10; G02F 1/01; H01L 33/38; H01L 33/58; G02B 26/007
See application file for complete search history.

(56) References Cited

U.S. PATENT DOCUMENTS

| 10,297,212 B2 * | 5/2019 | Sako ..................... G09G 3/3607 |
| 2005/0195470 A1 * | 9/2005 | Takeda .................. G02F 1/1333 359/296 |

(Continued)

FOREIGN PATENT DOCUMENTS

| CN | 101136181 A     | 3/2008 |
| CN | 201739810 U  *  | 2/2011 |

(Continued)

OTHER PUBLICATIONS

First Chinese Office Action dated Jul. 30, 2019.
Search Report and Written Opinion dated Jan. 29, 2018 from State Intellectual Property Office of the P.R. China.

*Primary Examiner* — Amy Cohen Johnson
*Assistant Examiner* — Syed M Kaiser
(74) *Attorney, Agent, or Firm* — Dilworth & Barrese, LLP.; Michael J. Musella, Esq.

(57) ABSTRACT

A light source and a lighting device are provided. The light source includes a light emitting element configured to emit light and a light transmittance adjustment layer located on a light emitting surface of the light emitting element, and light transmittance of the light transmittance adjustment layer is adjustable.

19 Claims, 8 Drawing Sheets

(56) References Cited

U.S. PATENT DOCUMENTS

| | | | | |
|---|---|---|---|---|
| 2007/0121438 A1* | 5/2007 | Yamada | G11B 7/00375 | 369/44.25 |
| 2008/0182081 A1* | 7/2008 | Jeon | G03F 7/201 | 428/195.1 |
| 2009/0206963 A1* | 8/2009 | Nguyen | H01G 5/0136 | 334/14 |
| 2009/0207723 A1* | 8/2009 | Ito | C08F 283/10 | 369/283 |
| 2010/0134429 A1* | 6/2010 | You | G06F 3/044 | 345/173 |
| 2010/0176413 A1* | 7/2010 | Lin | H01L 33/46 | 257/98 |
| 2011/0062476 A1* | 3/2011 | Tobise | G02B 3/0031 | 257/98 |
| 2012/0060175 A1* | 3/2012 | Oshio | G11B 7/24038 | 720/718 |
| 2012/0099412 A1* | 4/2012 | Oshio | G02B 1/04 | 369/100 |
| 2012/0146971 A1* | 6/2012 | Yoon | G02F 1/133707 | 345/205 |
| 2012/0194065 A1* | 8/2012 | Aoki | H01L 51/5275 | 313/504 |
| 2013/0033901 A1* | 2/2013 | Nishitani | G02B 6/0036 | 362/613 |
| 2013/0105850 A1* | 5/2013 | Komatsu | H01L 33/505 | 257/98 |
| 2013/0175898 A1* | 7/2013 | Brokken | G02B 26/0825 | 310/300 |
| 2013/0222881 A1* | 8/2013 | Aizenberg | E06B 9/24 | 359/291 |
| 2013/0328056 A1* | 12/2013 | Kwon | H01L 33/12 | 257/76 |
| 2014/0125935 A1* | 5/2014 | Nakamura | G02F 1/1339 | 349/153 |
| 2014/0177025 A1* | 6/2014 | Lee | G02B 26/026 | 359/245 |
| 2014/0277739 A1* | 9/2014 | Kornbluh | B25J 9/1615 | 700/260 |
| 2015/0029455 A1* | 1/2015 | Kim | G02F 1/133788 | 349/129 |
| 2015/0205092 A1* | 7/2015 | Sasagawa | G02B 26/001 | 359/290 |
| 2016/0026061 A1* | 1/2016 | O'Keeffe | G02F 1/167 | 359/296 |
| 2016/0043321 A1* | 2/2016 | Kwon | H01L 51/0013 | 156/230 |
| 2016/0077328 A1* | 3/2016 | Chong | G02B 26/02 | 349/62 |
| 2016/0085131 A1* | 3/2016 | Lam | B60J 3/04 | 359/244 |
| 2016/0190400 A1* | 6/2016 | Jung | H01L 33/50 | 362/97.1 |
| 2016/0363723 A1* | 12/2016 | Choi | G02B 6/0091 | |
| 2017/0003564 A1* | 1/2017 | Gillaspie | B23K 20/10 | |
| 2017/0084867 A1* | 3/2017 | Lim | H01L 27/3244 | |
| 2017/0219859 A1* | 8/2017 | Christophy | G02F 1/1323 | |
| 2017/0344785 A1* | 11/2017 | Zhang | G06K 9/0004 | |
| 2018/0095312 A1* | 4/2018 | Kubota | G02F 1/133345 | |
| 2018/0190087 A1* | 7/2018 | Maalouf | G08B 6/00 | |
| 2018/0246318 A1* | 8/2018 | Shian | G02B 26/02 | |
| 2019/0171103 A1* | 6/2019 | Shimoyama | G03F 7/031 | |
| 2019/0251897 A1* | 8/2019 | Toyama | G02B 5/201 | |
| 2019/0281683 A1* | 9/2019 | Liu | H01L 33/58 | |

FOREIGN PATENT DOCUMENTS

| | | |
|---|---|---|
| CN | 201739810 U | 2/2011 |
| CN | 103025991 A | 4/2013 |
| CN | 203684127 U | 7/2014 |
| CN | 105508909 A | 4/2016 |
| CN | 105700204 A | 6/2016 |
| CN | 106164765 A | 11/2016 |
| CN | 106772735 A | 5/2017 |
| CN | 206327129 U | 7/2017 |
| JP | 2000028938 A | 1/2000 |
| JP | 201065537 A | 7/2010 |

* cited by examiner

LIGHT SOURCE AND LIGHTING DEVICE

CROSS REFERENCE OF RELATED APPLICATION

The application claims priority to the Chinese patent application No. 201710272056.6, filed on Apr. 24, 2017, the entire disclosure of which is incorporated herein by reference as part of the present application.

TECHNICAL FIELD

At least one embodiment of the present disclosure relates to a light source and a lighting device.

BACKGROUND

A light source can be used for lighting, as a backlight or for decorative purposes.

SUMMARY

At least one embodiment of the present disclosure provides a light source, comprising: a light emitting element configured to emit light; and a light transmittance adjustment layer located on a light emitting surface of the light emitting element, wherein light transmittance of the light transmittance adjustment layer is adjustable.

According to an embodiment of the present disclosure, the light source further comprises an electroactive layer, wherein the electroactive layer is connected with the light transmittance adjustment layer and configured to be deformed by an electric field to cause the light transmittance adjustment layer to undergo deformation and adjust the light transmittance of light passing through the light transmittance adjustment layer.

According to an embodiment of the present disclosure, an amount of the deformation of the light transmittance adjustment layer increases as an amount of a deformation of the electroactive layer increases.

According to an embodiment of the present disclosure, a deformation of the light transmittance adjustment layer comprises a change in thickness of the light transmittance adjustment layer, and the light transmittance of the light transmittance adjustment layer increases as a thickness of the light transmittance adjustment layer decreases.

According to an embodiment of the present disclosure, a material of the light transmittance adjustment layer comprises polydimethylsiloxane.

According to an embodiment of the present disclosure, a material of the electroactive layer comprises an electrostriction material.

According to an embodiment of the present disclosure, the electroactive layer is configured to be shortened by an electric field to stretch the light transmittance adjustment layer so that a thickness of the light transmittance adjustment layer is reduced.

According to an embodiment of the present disclosure, the light source further comprises a first electrode and a second electrode, wherein the first electrode and the second electrode are insulated from each other and configured to form the electric field, the light transmittance adjustment layer is directly connected with the electroactive layer, the first electrode and the second electrode are respectively connected with the electroactive layer, and the electroactive layer is configured to be deformed by the electric field formed between the first electrode and the second electrode.

According to an embodiment of the present disclosure, the light source further comprises a first electrode and a second electrode, wherein the first electrode and the second electrode are insulated from each other and configured to form the electric field, the electroactive layer and the second electrode are respectively connected with the light transmittance adjustment layer, the first electrode and the light transmittance adjustment layer are respectively connected with the electroactive layer, and the electroactive layer is configured to be deformed by the electric field formed between the first electrode and the second electrode.

According to an embodiment of the present disclosure, the light source further comprises a first electrode and a second electrode, wherein the first electrode and the second electrode are insulated from each other and configured to form the electric field, and the electroactive layer comprises a first sub-layer and a second sub-layer separated from each other, wherein the first sub-layer and the second sub-layer are located at both ends of the light transmittance adjustment layer and respectively connected with the light transmittance adjustment layer; wherein the first sub-layer is connected with the first electrode, and the second sub-layer is connected with the second electrode, and the first electrode is located at a side of the first sub-layer far away from the light transmittance adjustment layer, and the second electrode is located at a side of the second sub-layer far away from the light transmittance adjustment layer, and the first sub-layer and the second sub-layer are configured to be deformed by the electric field formed between the first electrode and the second electrode.

According to an embodiment of the present disclosure, the first electrode comprises a plurality of first sub-electrodes insulated from each other, and the second electrode comprises a plurality of second sub-electrodes insulated from each other, wherein the plurality of first sub-electrodes and the plurality of second sub-electrodes are insulated from each other, and the electroactive layer comprises a plurality of electroactive material sub-layers, and the plurality of electroactive material sub-layers are configured to be deformed by the electric field formed between the first sub-electrodes and the plurality of second sub-electrodes.

According to an embodiment of the present disclosure, each of the plurality of first sub-electrodes is disposed opposite to one of plurality of second sub-electrodes to form an electric field to drive the electroactive material sub-layer therebetween to be deformed within the electric field.

According to an embodiment of the present disclosure, the light source further comprises a package substrate, wherein the package substrate comprises a recess, the light emitting element is located in the recess, a transparent encapsulation element is disposed outside the light emitting element, and the light transmittance adjustment layer is located on the transparent packaging element.

According to an embodiment of the present disclosure, a spacer layer is provided between the light transmittance adjustment layer and the transparent encapsulation element.

According to an embodiment of the present disclosure, the spacer layer comprises a transparent liquid layer.

According to an embodiment of the present disclosure, the light source further comprises an electroactive layer, a first electrode, and a second electrode, wherein the light transmittance adjustment layer is connected with the electroactive layer, the first electrode and the second electrode are respectively connected with the electroactive layer, the first electrode and the second electrode are located in a same layer, and the first electrode, the electroactive layer and the light transmittance adjustment layer are stacked; wherein a light emitting surface of the light source comprises a curved surface, the light transmittance adjustment layer is located on the curved surface, and the electroactive layer is located at a bottom side of the curved surface and at a side of the package substrate far away from the light emitting element.

According to an embodiment of the present disclosure, the light source further comprises an electroactive layer, a first electrode, and a second electrode, wherein the light transmittance adjustment layer is connected with the electroactive layer, the first electrode and the second electrode are respectively connected with the electroactive layer, and the first electrode, the second electrode, the electroactive layer and the light transmittance adjustment layer are disposed in a same layer, wherein a light-emitting surface of the light source comprises a planar surface, and the light transmittance adjustment layer is located on the planar surface.

At least one embodiment of the present disclosure further provides a lighting device comprising the light source provided by any one of embodiments of the present disclosure.

According to an embodiment of the present disclosure, the lighting device further comprises a driver circuit, wherein the lighting device comprises a plurality of light sources, and the driver circuit is configured to drive the plurality of light sources to obtain a pattern with variable shape and/or a pattern with adjustable brightness.

At least one embodiment of the present disclosure further provides a lighting device comprising the light source provided by any one of embodiments of the present disclosure, lighting device further comprises: an ambient light sensor configured to sense a brightness of ambient light, a memory and at least one processor; wherein the ambient light sensor, the memory and the at least one processor are signally connected with each other; wherein the memory is configured to store at least one calculation relationship of the following: a calculation relationship between the ambient light and a brightness of the light source required by a user, a calculation relationship between a brightness of the light source and light transmittance of the light transmittance adjustment layer, and a calculation relationship between light transmittance of the light transmittance adjustment layer and an amount of the deformation, a calculation relationship between an amount of the deformation of the light transmittance adjustment layer and an amount of the deformation of the electroactive layer, a calculation relationship between an amount of the deformation of the electroactive layer and an applied voltage; wherein the memory is further configured to store an instruction being capable to be executed by a computer, and the instruction is configured to drive the at least one processor to execute of the following steps: converting an ambient light brightness being sensed into a voltage signal for forming the electric field; and outputting the voltage signal to the light source for adjusting the brightness of the light source in real time.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The lighting device basically includes a light emitting element and a transparent encapsulation element (encapsulation lens) for providing illumination. The brightness adjustment is usually directly controlled by an electric current through a control switch button, and this method easily makes an electric signal of the light emitting element unstable, and the service life of the light emitting element is shortened.

Figure 1:
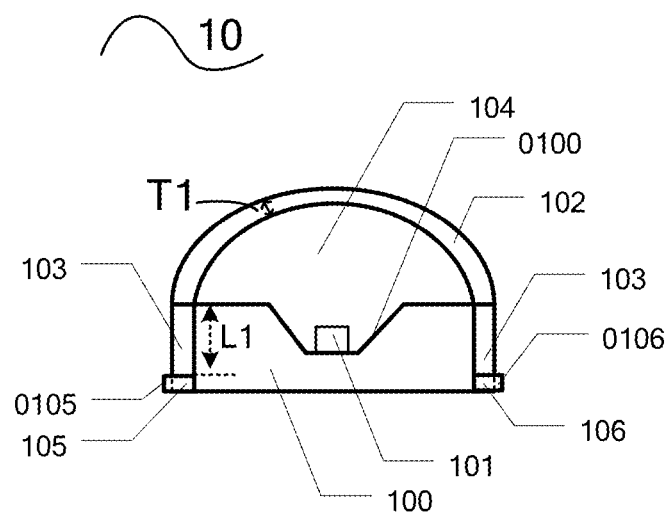
FIG. 1 is a schematic view of a light source according to an embodiment of the present disclosure.

As illustrated in FIG. 1, at least one embodiment of the present disclosure provides a light source 10, including: a light emitting element 101 configured to emit light; a light transmittance adjustment layer 102, located on a light emitting surface of the light emitting element 101 and configured to adjust transmittance (light transmittance) of light passing through the light transmittance adjustment layer 102. The light transmittance of the light transmittance adjustment layer 102 can be adjusted. For example, the light emitting element is any self-luminescent elements such as a light emitting chip and a PN junction. For example, the light transmittance adjustment layer 102 can have a uniform thickness at different positions.

In the light source provided by at least one embodiment of the disclosure, the light transmittance of the light transmittance adjustment layer 102 is adjustable, so that the brightness of the light source 10 can be adjusted, and the light transmittance can be adjusted according to requirements, thereby realizing that the brightness of the light source can be adjusted. There is no need to adjust the electric current of the light emitting element, the electric signal of the light emitting element is stable, and the service life of the light emitting element is long.

For example, the light transmittance adjustment layer 102 can have two states, a light transmission state and an opaque state, and the light transmittance of the light transmittance adjustment layer 102 can increase as a thickness of the light transmittance adjustment layer 102 decreases. For example, the light transmittance adjustment layer 102 can be deformed and the deformation is reversible. The light transmittance adjustment layer 102 can be switched between the light transmission state and the opaque state, and the light transmittance can be adjusted. For example, an initial state of the light transmittance adjustment layer 102 can be an opaque state, and can also be a light transmission state. For example, after the thickness of the light transmittance adjustment layer 102 is changed, the thickness of the light transmittance adjustment layer 102 at different positions is uniform, but is not limited thereto.

The light transmittance adjustment layer 102 which is reversibly deformable can be made of any suitable materials, such as an optical plastic material and an optical elastic polymer. Suitable materials for making the reversibly deformable light transmittance adjustment layer 102 includes, but is not limited to, polydimethylsiloxane (PDMS), polycarbonate, polystyrene and polymethyl methacrylate, and various alternatives and derivatives thereof. In the embodiment of the present disclosure, polydimethylsiloxane (PDMS) is taken as an example as the material of the light transmittance adjustment layer 102.

For example, the light transmittance adjustment layer in an unstretched state is opaque, and after being stretched, the light transmittance adjustment layer can transmit light. The light transmittance of the light transmittance adjustment layer increases as a thickness of the light transmittance adjustment layer decreases. For example, the light transmittance adjustment layer in an unstretched state can have opaque blocks so that it does not transmit light. For example, an initial state of the light transmittance adjustment layer can be in an unstretched state. Of course, the initial state of the light transmittance adjustment layer can also be in a stretched state.

The thinner the light transmittance adjustment layer is, the greater the light transmittance is. In a case that the light transmittance adjustment layer is in an unstretched state, the material is in a blurred state, light is hardly transmitted through the film (light transmittance adjustment layer), and when applied by a force, the film is stretched and deformed and the material gradually becomes transparent and light will pass through the film in large quantities. $T=T_0\lambda$, $T_0=10^{-\varepsilon Ch_0}$, where T refers to light transmittance after being stretched, $T_0$ refers to light transmittance before being stretched, $\lambda=h/h_0$, $\lambda$ refers to a stretching coefficient, and h refers to a film thickness of the light transmittance adjustment layer after being stretched, C refers to a doping concentration, $h_0$ refers to an initial thickness of the light transmittance adjustment layer, and $\varepsilon$ refers to a constant value parameter.

As illustrated in FIG. 1, according to the light source provided by an embodiment of the present disclosure, the light source further includes an electroactive layer 103. The electroactive layer 103 is connected with the light transmittance adjustment layer 102, and is configured to be deformed by an electric field, so as to enables the light transmittance adjustment layer 102 to undergo deformation, and further to adjust transmittance of light passing through the light transmittance adjustment layer 102.

According to the light source provided by an embodiment of the present disclosure, an amount of deformation of the light transmittance adjustment layer 102 increases as an amount of deformation of the electroactive layer 103 increases. That is, if the amount of deformation in the electroactive layer 103 increases, then the amount of deformation in the light transmittance adjustment layer 102 increases. The amount of deformation is greater than zero.

According to the light source provided by an embodiment of the present disclosure, the deformation of the light transmittance adjustment layer 102 includes a change in thickness thereof, and the light transmittance of the light transmittance adjustment layer 102 increases as the thickness of the light transmittance adjustment layer decreases. Deformation includes positive and negative deformations. The thickness of the light transmittance adjustment layer 102 refers to, for example, a thickness of the light transmittance adjustment layer in a light emitting direction. For example, a length of the electroactive layer 103 is shortened so that the thickness of the light transmittance adjustment layer 102 is reduced.

The electroactive layer can be made of any suitable electrostriction materials such as electrostriction ceramics, electrostriction polymers, electrostriction valves, and the like. Suitable electrostriction materials include, but are not limited to, a polyurethane-containing material. For example, the polyurethane-containing material includes a doped polyurethane material.

The electroactive layer can be made of any suitable piezoelectric materials. Suitable piezoelectric materials include, but are not limited to, lead zirconate titanate, zinc oxide, barium titanate, lead titanate, and various alternatives and derivatives thereof (e.g., doped with one or more dopants).

It should be noted that, the term "electroactive material" refers to a material that one or more feature sizes can be reversibly changed according to an applied voltage. The term "electroactive layer" refers to a layer of an electroactive material included in the light source in an embodiment of the present disclosure and capable of reversibly changing one or more feature sizes depending on the applied voltage. For example, the electroactive material is an electrostriction material. For example, the electrostriction material can be stretched or shortened under an electric field. The stress and strain of an electrostriction material responding to an electric field is proportional to the square of the electric field. For example, the electroactive material is a piezoelectric material. For example, the stress and strain of a piezoelectric material responding to an electric field is proportional to the electric field.

Figure 2:
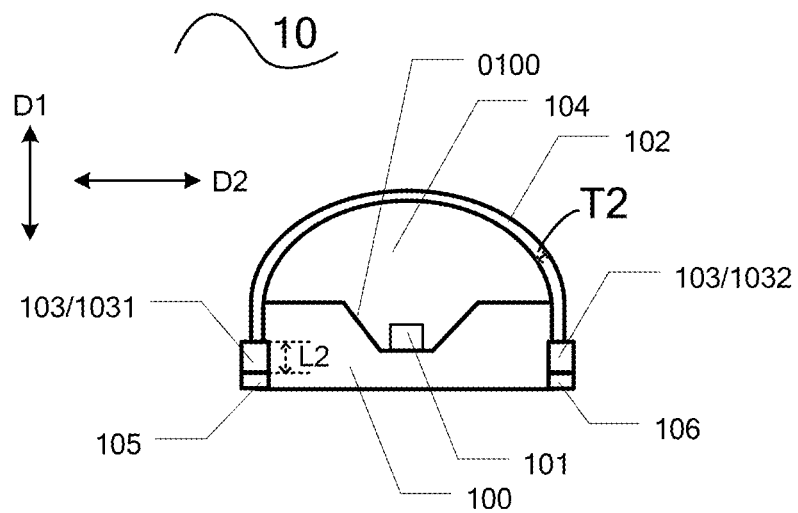
FIG. 2 is a schematic view illustrating a light transmittance adjustment layer being stretched due to contraction of an electroactive layer of the light source illustrated in FIG. 1.

As illustrated in FIG. 2, according to the light source provided by an embodiment of the present disclosure, the electroactive layer 103 is configured to be shortened by an electric field to stretch the light transmittance adjustment layer 102 to reduce a thickness of the light transmittance adjustment layer 102. Thus, the light source can be converted from an opaque state to a light transmission state, or the brightness of the light source can be increased, for example, the brightness of the light source can be increased from a low brightness to a high brightness.

For example, as illustrated in FIGS. 1 and 2, the electroactive layer 103 is shortened from L1 to L2 by an electric field, so that the light transmittance adjustment layer 102 is stretched, and a thickness of the light transmittance adjustment layer 102 is decreased from T1 To T2.

For example, the thickness of the light transmittance adjustment layer 102 is controlled in accordance with a pressing force or a stretching force of the electroactive material, thereby controlling the light transmittance and brightness. The thinner the light transmittance adjustment layer 102 is, the greater the light transmittance is.

As illustrated in FIGS. 1 and 2, according to the light source provided by an embodiment of the present disclosure, the light source further includes a package substrate 100. The package substrate 100 includes a recess 0100. The light emitting element 101 is located in the recess 0100. A transparent encapsulation element 104 is located outside the light emitting element 101. The light transmittance adjustment layer 102 can be located on the transparent encapsulation element 104. For example, the transparent encapsulation element 104 is a transparent encapsulation lens, and a material thereof can include epoxy resin, but is not limited thereto.

Figure 4:
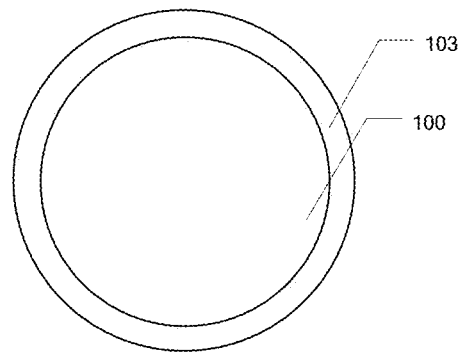
FIG. 4 is a schematic plan view of an arrangement position of an electroactive layer in a light source provided by an embodiment of the present disclosure.
Figure 5:
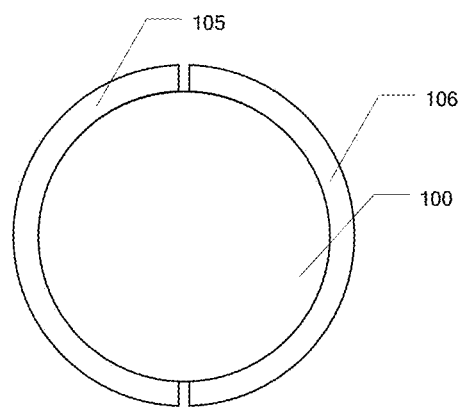
FIG. 5 is a schematic plan view of an arrangement position of a first electrode and a second electrode in a light source provided by an embodiment of the present disclosure.

As illustrated in FIGS. 1 and 2, according to the light source provided by an embodiment of the present disclosure, the light source further includes a first electrode 105 and a second electrode 106. The first electrode 105 and the second electrode 106 are insulated from each other and configured to form an electric field. The top view of the electroactive layer 103 can be as illustrated in FIG. 4, and the electroactive layer 103 is located around the package substrate 100 and in contact with the package substrate 100. The top view of the first electrode 105 and the second electrode 106 can be as illustrated in FIG. 5, the first electrode 105 and the second electrode 106 are located around the package substrate 100 and in contact with the package substrate 100. The first electrode 105 and the second electrode 106 are connected with the electroactive layer 103 respectively, and are in contact with the electroactive layer 103 respectively. For example, as illustrated in FIGS. 1 and 2, the electroactive layer 103 is shortened in a first direction D1 (vertical direction in FIGS. 1 and 2) and is elongated in a second direction D2 (horizontal direction) perpendicular to the first direction. As illustrated in FIG. 1, the first electrode 105 and/or the second electrode 106 can have protrusions 0105, 0106 protruding beyond the electroactive layer 103 respectively, so that the electroactive layer 103 after being deformed can be supported by the protrusions. For example, as illustrated in FIG. 1, the first electrode 105 has a protrusion 0105 protruding beyond the electroactive layer 103 in a direction perpendicular to a direction in which the length of the electroactive layer 103 is shortened, and the second electrode 106 has a protrusion 0106 protruding beyond the electroactive layer 103 in a direction perpendicular to a direction in which the length of the electroactive layer 103 is shortened.

As illustrated in FIG. 1, according to the light source provided by an embodiment of the present disclosure, the light transmittance adjustment layer 102 is connected with the electroactive layer 103, and the first electrode 105 and the second electrode 106 are respectively connected with the electroactive layer 103. The first electrode 105 and the second electrode 106 are located in the same layer. The first electrode 105, the electroactive layer 103, and the light transmittance adjustment layer 102 are stacked. A light emitting surface of the light source includes a curved surface, and the light transmittance adjustment layer 102 is located on the curved surface. The electroactive layer 103 is located at a bottom side of the curved surface and on the side of the package substrate 100 far away from the light emitting element 101.

For example, one of the first electrode 105 and the second electrode 106 can be not applied with a signal, the voltage is 0, and the other of the first electrode 105 and the second electrode 106 can be applied with a positive voltage or a negative voltage, but it is not limited thereto. As long as an electric field can be formed between the first electrode 105 and the second electrode 106.

Figure 3:
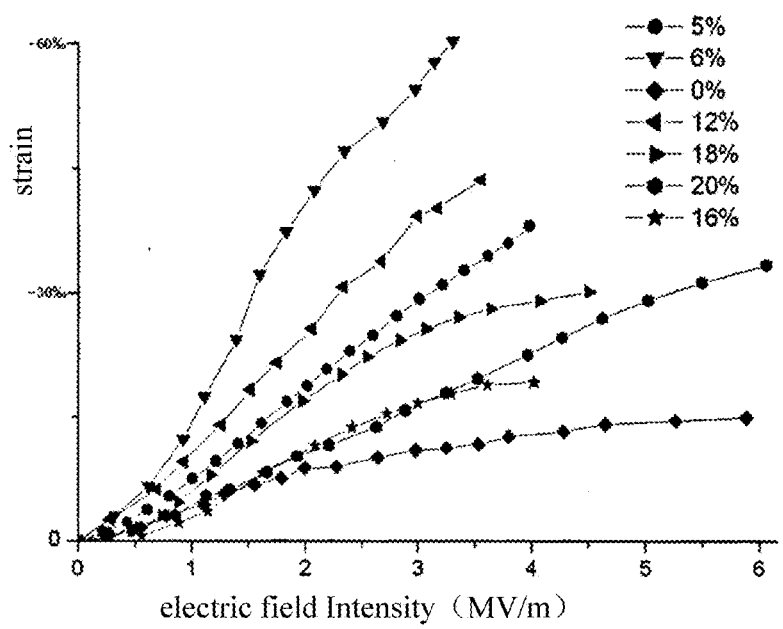
FIG. 3 is a diagram illustrating a relationship between intensity of an electric field applied to the electroactive layer and a strain of the electroactive layer.

For example, as illustrated in FIG. 3, a length of the electrostriction material changes with the voltage applied on two ends of the electrostriction material, and can be expressed as $X=RE^2$, where X refers to a strain of the electrostriction material by an voltage or electric field, R refers to an electrostriction coefficient, and E refers to a strength of voltage value/electric field applied at both ends of the material. FIG. 3 illustrates a correlation between stress and strain response of an electrostriction material and an intensity of an electric field applied to the electrostriction material in some embodiments. As illustrated in FIG. 3, the electrostriction material used in the examples was polyurethane doped with barium titanate of various concentrations. In a case that a voltage of 3V (electric field strength 1 MV/m) is applied to a material with a thickness of 1 mm, the polyurethane elastomer material doped with 6% barium titanate has the largest deformation, up to 50%. The magnitude of electrostriction strain is also related to the elasticity of polyurethane. In a certain thickness range (0.1 mm~2 mm) of the sample, as the thickness of the sample decreases, the quadratic relationship between the strain and the electric field remains unchanged. However, when the coefficient R increases, the strain changes more obviously.

As illustrated in FIG. 4, according to the light source provided by an embodiment of the present disclosure, the electroactive layer 103 is located on a periphery of the package substrate 100 and is in contact with the package substrate 100.

As illustrated in FIG. 5, according to the light source provided by an embodiment of the present disclosure, the first electrode 105 and the second electrode 106 are located on a periphery of the package substrate 100 and are in contact with the package substrate 100 respectively.

As illustrated in FIGS. 1 and 5, according to the light source provided by an embodiment of the present disclosure, the light transmittance adjustment layer 102 is directly connected with the electroactive layer 103, and the first electrode 105 and the second electrode 106 are connected with the electroactive layer 103 respectively. The electroactive layer 103 is deformed by an electric field formed between the first electrode 105 and the second electrode 106.

Figure 6:
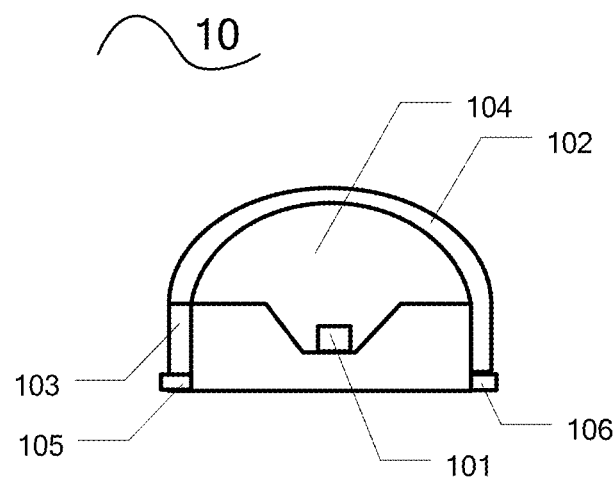
FIG. 6 is a schematic view of another light source provided by an embodiment of the present disclosure.

As illustrated in FIG. 6, according to the light source provided by an embodiment of the present disclosure, the electroactive layer 103 and the second electrode 106 are respectively connected with the light transmittance adjustment layer 102, and the first electrode 105 and the light transmittance adjustment layer 102 are respectively connected with the electroactive layer 103. The electroactive layer 103 is deformed by an electric field formed between the first electrode 105 and the second electrode 106.

Figure 7:
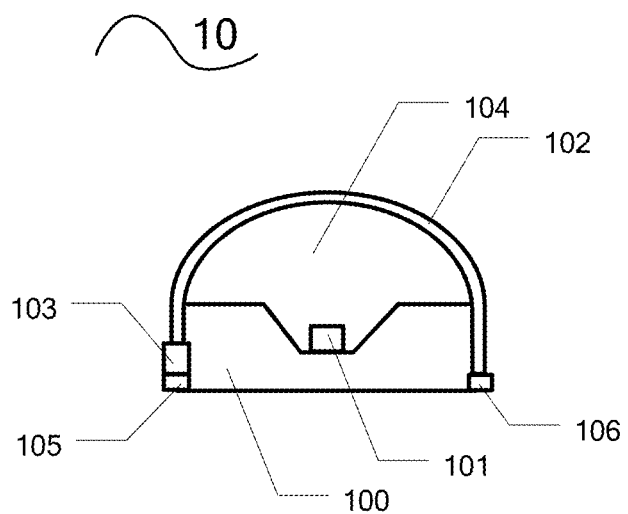
FIG. 7 is a schematic view illustrating a light transmittance adjustment layer being stretched due to contraction of an electroactive layer of the light source illustrated in FIG. 6.
Figure 8:
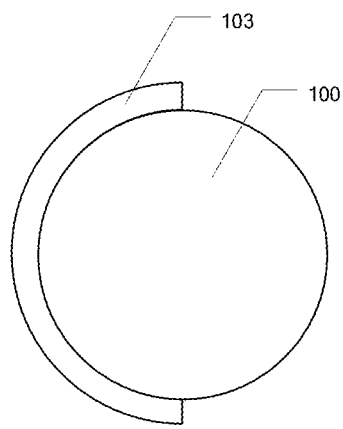
FIG. 8 is a schematic view of an electroactive layer and an arrangement position thereof in a light source according to an embodiment of the present disclosure.
Figure 9:
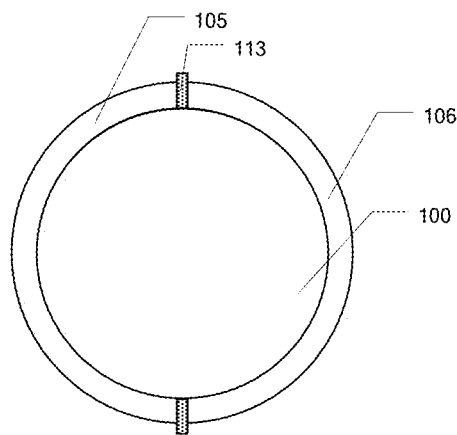
FIG. 9 is a schematic view of an arrangement position of a first electrode and a second electrode in the light source illustrated in FIG. 7.

As illustrated in FIGS. 6-9, according to the light source provided by an embodiment of the present disclosure, the electroactive layer 103 can be connected with the first electrode 105, the light transmittance adjustment layer 102 can be connected with the second electrode 106, and the electroactive layer 103 can be deformed by an electric field formed between the first electrode 105 and the second electrode 106. FIG. 7 is a schematic view of the light transmittance adjustment layer being stretched caused by contraction of the electroactive layer of the light source illustrated in FIG. 6. FIG. 8 is a schematic view of an electroactive layer and an arrangement position thereof in a light source according to an embodiment of the present disclosure. As illustrated in FIG. 9, the first electrode 105 and the second electrode 106 can be electrically insulated by providing an insulating layer 113 therebetween.

Figure 10:
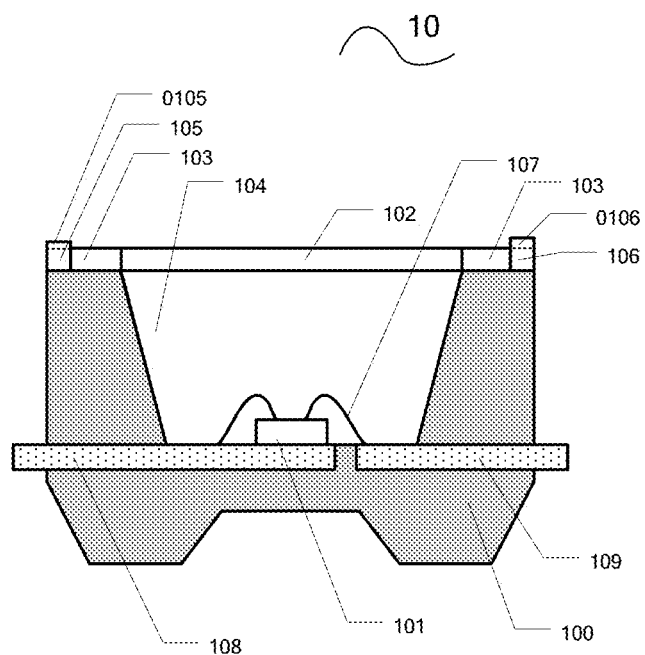
FIG. 10 is a schematic view of another light source provided by an embodiment of the present disclosure.
Figure 11:
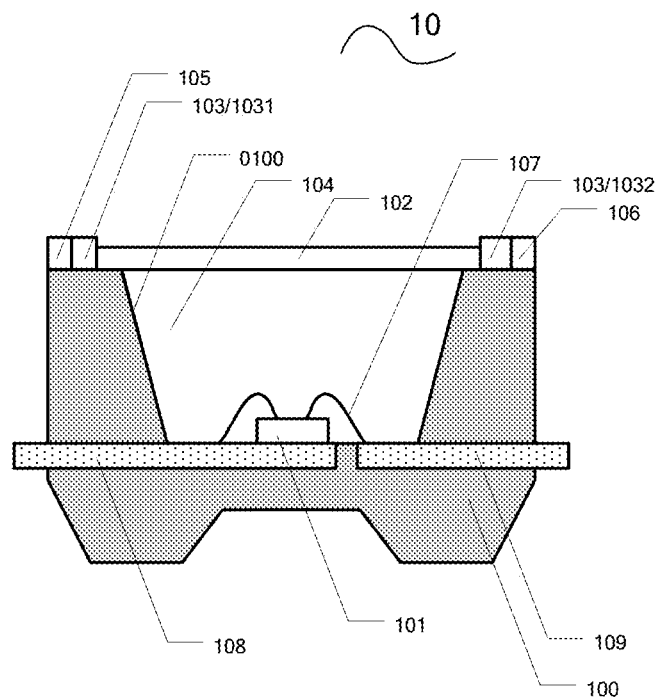
FIG. 11 is a schematic view illustrating a light transmittance adjustment layer being stretched due to contraction of an electroactive layer of the light source illustrated in FIG. 10.

The light source, in which transparent packaging element is a lens covering an upper surface of the package substrate, and the electroactive layer 103, the first electrode 105 and the second electrode 106 are all located on a side surface of the packaging substrate 100, and the light transmittance adjustment layer is located on a curved surface, is illustrated as an example, but the embodiment of the present disclosure is not limited thereto. For example, the light source can also has a structure as illustrated in FIGS. 10 and 11, a transparent encapsulation element 104 is located in a recess 0100 of a package substrate 100, a light transmittance adjustment layer 102 can be located on a transparent encapsulation element 104, and an electroactive layer 103, a first electrode 105 and a second electrode 106 are located on an upper surface of the package substrate 100, the upper surface is a planar surface, and the light transmittance adjustment layer is located on the planar surface. A connection lead 107, a first lead-out electrode 108, and a second lead-out electrode 109 are also illustrated in FIG. 10. The first lead-out electrode 108 and the second lead-out electrode 109 are respectively connected with an external circuit through respective connection leads 107. The first lead-out electrode 108, the second lead-out electrode 109, the first electrode 105, and the second electrode 106 are insulated from each other. The positions of the first lead-out electrode 108 and the second lead-out electrode 109 are not limited to those illustrated in the figure. For convenience of illustration, the first lead-out electrode and the second lead-out electrode are not illustrated in FIGS. 1 and 2, and the requirements for the arrangement can also be the same as those for the first lead-out electrode 108 and the second lead-out electrode 109 illustrated in FIG. 10.

As illustrated in FIG. 10, according to the light source provided by an embodiment of the present disclosure, the light source includes an electroactive layer 103, a first electrode 105, and a second electrode 106. The light transmittance adjustment layer 102 is connected with the electroactive layer 103, and the first electrode 105 and the second electrode 106 are respectively connected with the electroactive layer 103. The first electrode 105, the second electrode 106, the electroactive layer 103, and the light transmittance adjustment layer 102 are located in the same layer. A light emitting surface of the light source includes a planar surface, and the light transmittance adjustment layer 102 is located on the planar surface.

FIG. 10 is a schematic view of a light source in an initial state or without an electric field applied on.

FIG. 11 is a schematic view of a light source in which the electroactive layer 103 is contracted by an electric field so as to stretch the light transmittance adjustment layer 102. As illustrated in FIG. 10, the first electrode 105 and/or the second electrode 106 can have protrusions 0105 and 0106 protruding beyond the electroactive layer 103 respectively, so that the electroactive layer 103 after being deformed can be supported by the protrusions. For example, as illustrated in FIG. 10, the first electrode 105 has a protrusion 0105 protruding beyond the electroactive layer 103 in a direction perpendicular to a direction in length change (length being shortened) of the electroactive layer 103, and the second electrode 106 has a protrusion 0106 protruding beyond the electroactive layer 103 in a direction perpendicular to a direction in length change (length being shortened) of the electroactive layer 103.

Figure 12:
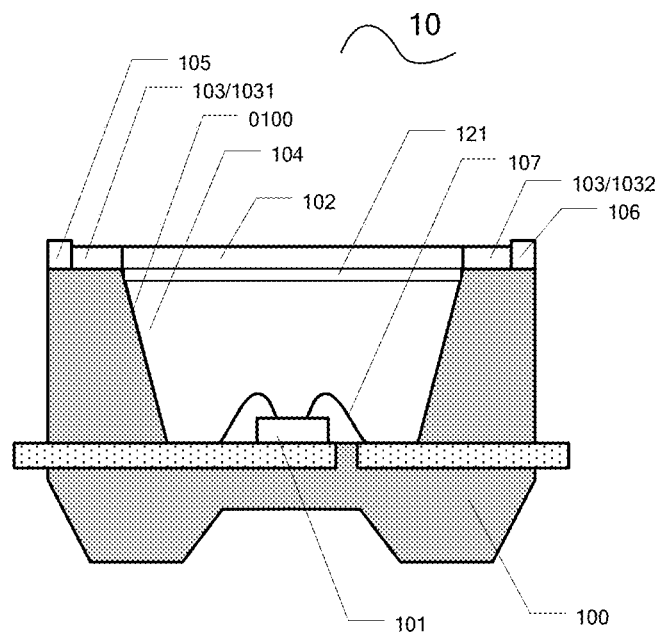
FIG. 12 is a schematic view of another light source provided by an embodiment of the present disclosure.

As illustrated in FIG. 12, according to the light source provided by an embodiment of the present disclosure, a spacer layer 121 can be located between the light transmittance adjustment layer 102 and the transparent encapsulation element 104 in order to reduce deformation resistance.

According to the light source provided by an embodiment of the present disclosure, the spacer layer 121 can include a transparent liquid layer. For example, the transparent liquid layer can include an oily transparent solution. For example, the oily transparent solution is not affected by the formation of the light transmittance adjustment layer 102. The spacer layer 121 can also be a lubricating layer, which can include a solid lubricant or a liquid lubricant.

It should be noted that, in order to reduce deformation resistance, a structure of the light source illustrated in FIG.

1 can also be provided with a spacer layer 121 between the light transmittance adjustment layer 102 and the transparent encapsulation element 104.

Figure 13:
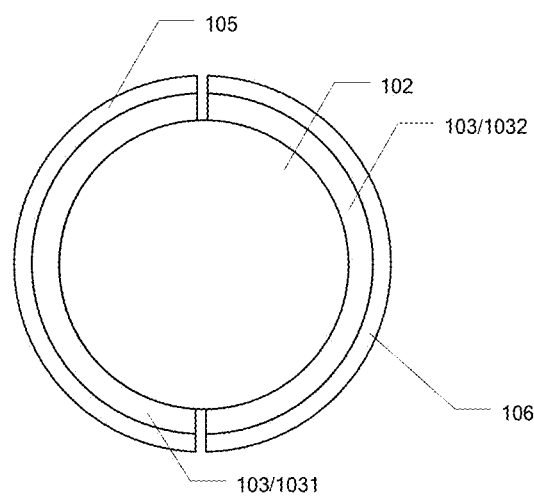
FIG. 13 is a schematic view of an arrangement position of an electroactive layer, a first electrode, and a second electrode in a light source provided by an embodiment of the present disclosure.

As illustrated in FIG. 13, according to the light source provided by an embodiment of the present disclosure, the electroactive layer 103 includes a first sub-layer 1031 and a second sub-layer 1032 separated from each other. The first sub-layer 1031 and the second sub-layer 1032 are located at two ends of the light transmittance adjustment layer 102, and are respectively connected with the light transmittance adjustment layer 102. The first electrode 105 is located at a side of the first sub-layer 1031 far away from the light transmittance adjustment layer 102, and the second electrode 106 is located at a side of the second sub-layer 1032 far away from the light transmittance adjustment layer 102. The first sub-layer 1031 is connected with the first electrode 105. The second sub-layer 1032 is connected with the second electrode 106. The first sub-layer 1031 and the second sub-layer 1032 are both deformed by an electric field between the first electrode 105 and the second electrode 106.

Figure 14:
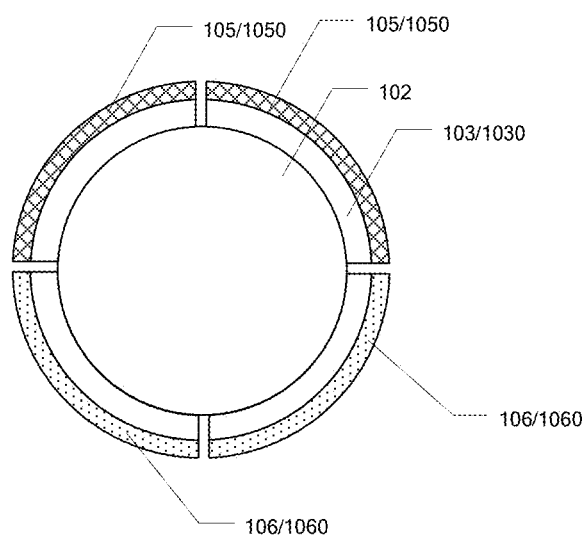
FIG. 14 is a schematic view of an arrangement position of an electroactive layer, a first electrode, and a second electrode in another light source provided by an embodiment of the present disclosure.

As illustrated in FIG. 14, according to the light source provided by an embodiment of the present disclosure, the first electrode 105 includes a plurality of first sub-electrodes 1050 insulated from each other, and the second electrode 106 includes a plurality of second sub-electrodes 1060 insulated from each other. The first sub-electrode 1050 and the plurality of second sub-electrodes 1060 are insulated from each other. Each of the plurality of first sub-electrodes 1050 is located opposite to one of the plurality of second sub-electrodes 1060. The electroactive layer 103 includes a plurality of electroactive material sub-layers 1030. The plurality of electroactive material sub-layers 1030 are deformed by the electric field formed between the plurality of first sub-electrodes 1050 and the plurality of second sub-electrodes 1060.

For example, each of the plurality of first sub-electrodes 1050 is located opposite to one of the plurality of second sub-electrodes 1060 for forming an electric field to drive the electroactive material sub-layer 1030 therebetween to deform. For example, the first sub-electrode 1050 and the second sub-electrode 1060 which are opposite to each other are configured to drive the electroactive material sub-layer 1030 located therebetween to deform.

Figure 15:
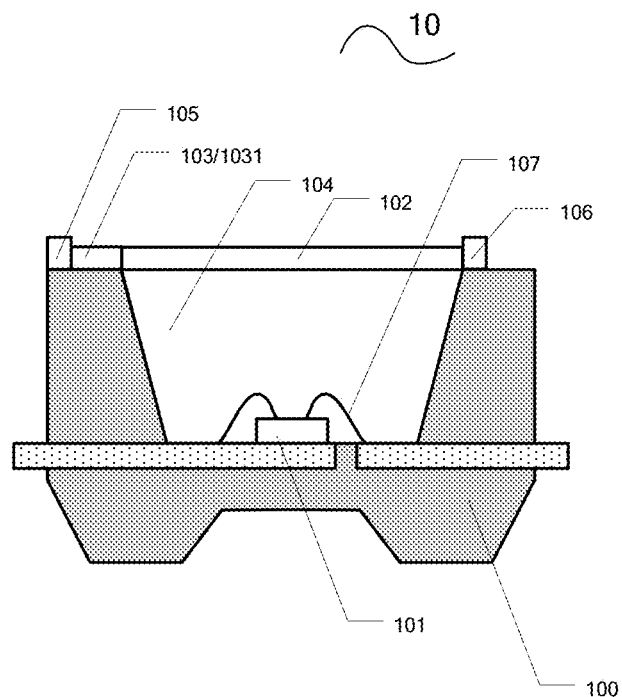
FIG. 15 is a schematic view of another light source provided by an embodiment of the present disclosure.
Figure 16:
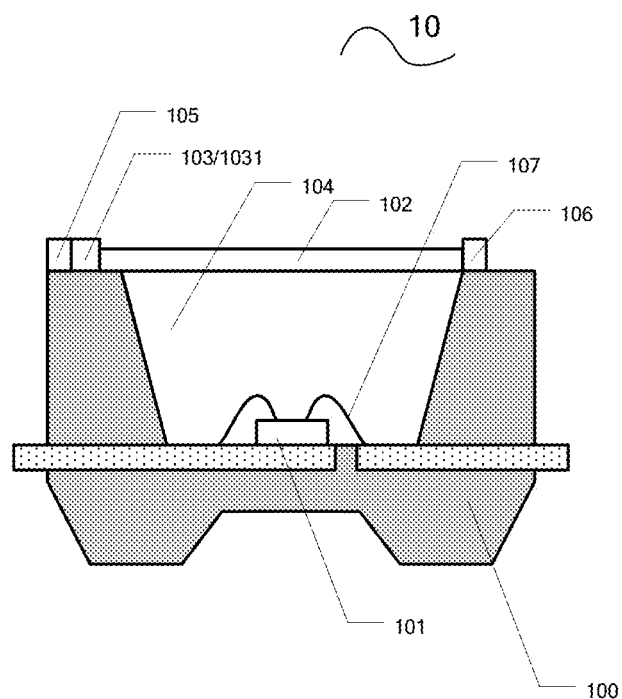
FIG. 16 is a schematic view illustrating a light transmittance adjustment layer being stretched due to contraction of an electroactive layer of the light source illustrated in FIG. 15.
Figure 17:
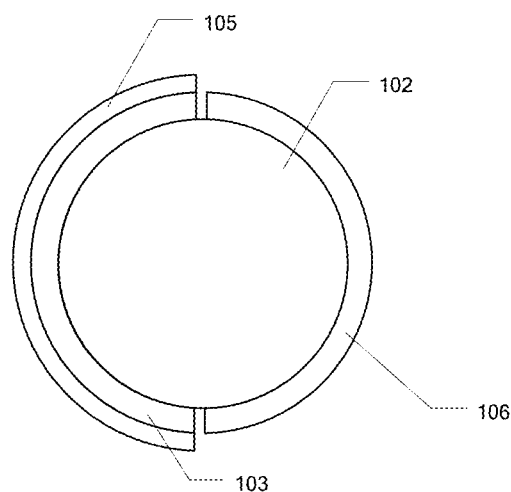
FIG. 17 is a schematic view of an arrangement position of an electroactive layer, a first electrode and a second electrode in a light source according to an embodiment of the present disclosure.

According to the light source provided by an embodiment of the present disclosure, as illustrated in FIGS. 15-17, the electroactive layer 103 can be located only on one side of the light transmittance adjustment layer 102.

According to the light source provided by an embodiment of the present disclosure, the light source further includes leads connected with the light emitting element, the first electrode, and the second electrode, respectively. Due to the arrangement of the light transmittance adjustment layer 102, a stable signal can be applied to the light emitting element by the lead connected with the light emitting element.

At least one embodiment of the present disclosure provides a lighting device including any one of the above-mentioned light sources.

Figure 18:
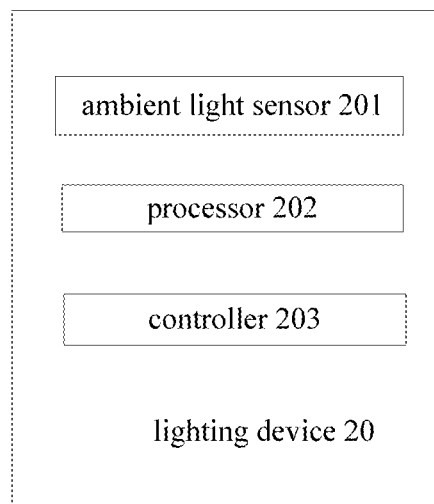
FIG. 18 is a schematic diagram of a lighting device provided by an embodiment of the present disclosure.

As illustrated in FIG. 18, according to the lighting device provided by an embodiment of the present disclosure, the lighting device 20 further includes an ambient light sensor 201, a processor 202, and a controller 203. The ambient light sensor 201 is configured to sense a brightness of ambient light. The processor 202 is configured to convert the brightness of ambient light to a voltage signal for forming an electric field. The controller 203 is configured to output the voltage signal.

For example, the processor 202 can implement a mapping relationship between the ambient light brightness and the voltage signal. A corresponding magnitude of the voltage signal can be mapped when the brightness is sensed. The processor 202 can include a brightness conversion circuit configured to convert the brightness into an electric signal. For example, the function of the controller 203 can also be implemented by the processor 202.

For example, the controller 203 can output a voltage signal to the first electrode and/or the second electrode, and further adjust the thickness of the light transmittance adjustment layer 102 according to an amount of ambient light to change the light transmittance.

According to an embodiment of the present disclosure, the lighting device further includes: an ambient light sensor configured to sense a brightness of ambient light, a memory, and at least one processor; wherein the ambient light sensor, the memory and the at least one processor are signally connected with each other; wherein the memory is configured to store at least one calculation relationship of the following: a calculation relationship between the ambient light and a brightness of the light source required by a user, a calculation relationship between a brightness of the light source and light transmittance of the light transmittance adjustment layer, and a calculation relationship between light transmittance of the light transmittance adjustment layer and an amount of the deformation, a calculation relationship between an amount of the deformation of the light transmittance adjustment layer and an amount of the deformation of the electroactive layer, a calculation relationship between an amount of the deformation of the electroactive layer and an applied voltage; wherein the memory is further configured to store an instruction executed by a computer, the instruction is configured to drive the at least one processor to perform the following steps: converting an ambient light brightness being sensed into a voltage signal for forming an electric field; and outputting the voltage signal to the light source for adjusting the brightness of the light source in real time. For example, outputting the voltage signal to the light source to adjust the light transmittance of the light transmittance adjustment layer in real time so as to adjust the brightness of the light source in real time. For example, outputting the voltage signal to the first electrode and the second electrode of the light source to adjust the light transmittance of the light transmittance adjustment layer in real time so as to adjust the brightness of the light source in real time.

According to the lighting device provided by the embodiments of the present disclosure, brightness dynamic adjustment can be achieved.

For example, the matching relationship between the ambient light and the brightness as required can be calculated, and this calculation relationship is previously provided in the lighting device circuit. A relationship between a brightness of the light source and a thickness of the light transmittance adjustment layer, and a relationship between a thickness of the light transmittance adjustment layer 102 and a voltage applied to the electroactive layer 103 can be provided. The current required light brightness is calculated according to the ambient light, the light transmittance is calculated according to the light brightness, a required deformation of the light transmittance adjustment layer is calculated according to the light transmittance of the light transmittance adjustment layer. A magnitude of the voltage applied to the electroactive layer 103 is calculated based on the deformation. Therefore, only the light transmittance of the light transmittance adjustment layer 102 above the light emitting element is changed, instead of changing electric current of the light emitting element, so that the electric current of the light source/lighting device is stable and the service life is long.

The light source provided by the embodiments of the present disclosure can be used in all devices that require illumination, such as in the improvement of the backlight source of the display device, in the display light source of the display screen, and in the light source for illumination.

Figure 19:
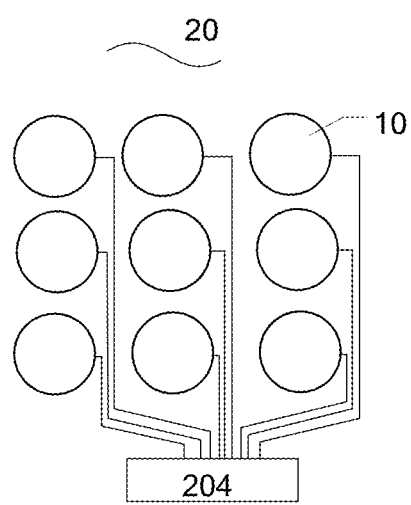
FIG. 19 is a schematic diagram of a lighting device provided by another embodiment of the present disclosure.

According to the lighting device provided by an embodiment of the present disclosure, as illustrated in FIG. 19, the lighting device further includes a driving circuit 204. The lighting device includes a plurality of light sources. The driving circuit 204 is configured to drive the plurality of light sources to obtain a pattern with variable-shape and/or a pattern with adjustable brightness. For example, it can be applied to a decorative light source that needs to form a certain pattern. The brightness of each of the plurality of light sources can be adjusted, and various patterns can be combined and matched. The number of light sources is not limited to that illustrated in FIG. 19, and the shape of the light source is not limited to that illustrated in FIG. 19.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(4) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A light source, comprising:
a light emitting element configured to emit light;
a light transmittance adjustment layer located on a light emitting surface of the light emitting element, wherein light transmittance of the light transmittance adjustment layer is adjustable;
a first electrode and a second electrode, the first electrode comprising a plurality of first sub-electrodes insulated from each other, and the second electrode comprising a plurality of second sub-electrodes insulated from each other, the plurality of first sub-electrodes and the plurality of second sub-electrodes are insulated from each other; and
an electroactive layer, connected with the light transmittance adjustment layer and comprising a plurality of electroactive material sub-layers, wherein the plurality of electroactive material sub-layers are configured to be deformed by an electric field formed between the first sub-electrodes and the plurality of second sub-electrodes, to adjust the light transmittance of the light transmittance adjustment layer.

2. The light source according to claim 1, wherein the electroactive layer is configured to be deformed by the electric field to cause the light transmittance adjustment layer to undergo deformation and adjust the light transmittance of light passing through the light transmittance adjustment layer.

3. The light source according to claim 2, wherein an amount of the deformation of the light transmittance adjustment layer increases as an amount of a deformation of the electroactive layer increases.

4. The light source according to claim 1, wherein a deformation of the light transmittance adjustment layer comprises a change in thickness of the light transmittance adjustment layer, and the light transmittance of the light transmittance adjustment layer increases as a thickness of the light transmittance adjustment layer decreases.

5. The light source according to claim 1, wherein a material of the light transmittance adjustment layer comprises polydimethylsiloxane.

6. The light source according to claim 2, wherein a material of the electroactive layer comprises an electrostriction material.

7. The light source according to claim 2, wherein the electroactive layer is configured to be shortened by an electric field to stretch the light transmittance adjustment layer so that a thickness of the light transmittance adjustment layer is reduced.

8. The light source according to claim 2, wherein the light transmittance adjustment layer is directly connected with the electroactive layer, the first electrode and the second electrode are respectively connected with the electroactive layer.

9. The light source according to claim 2, wherein the electroactive layer and the second electrode are respectively connected with the light transmittance adjustment layer, the first electrode and the light transmittance adjustment layer are respectively connected with the electroactive layer.

10. The light source according to claim 2, wherein the plurality of electroactive material sub-layers of the electroactive layer comprises a first sub-layer and a second sub-layer separated from each other, wherein the first sub-layer and the second sub-layer are located at both ends of the light transmittance adjustment layer and respectively connected with the light transmittance adjustment layer; wherein the first sub-layer is connected with the first electrode, and the second sub-layer is connected with the second electrode, and the first electrode is located at a side of the first sub-layer far away from the light transmittance adjustment layer, and the second electrode is located at a side of the second sub-layer far away from the light transmittance adjustment layer, and the first sub-layer and the second sub-layer are configured to be deformed by the electric field formed between the first electrode and the second electrode.

11. The light source according to claim 1, wherein each of the plurality of first sub-electrodes is disposed opposite to one of the plurality of second sub-electrodes to form the electric field to drive the electroactive material sub-layer therebetween to be deformed within the electric field.

12. The light source according to claim 1, further comprising a package substrate, wherein the package substrate comprises a recess, the light emitting element is located in the recess, a transparent encapsulation element is disposed outside the light emitting element, and the light transmittance adjustment layer is located on the transparent packaging element.

13. The light source according to claim 12, wherein a spacer layer is provided between the light transmittance adjustment layer and the transparent encapsulation element.

14. The light source according to claim 13, wherein the spacer layer comprises a transparent liquid layer.

15. The light source according to claim 12,
wherein the light transmittance adjustment layer is connected with the electroactive layer, the first electrode and the second electrode are respectively connected with the electroactive layer, the first electrode and the second electrode are located in a same layer, and the first electrode, the electroactive layer and the light transmittance adjustment layer are stacked;
wherein a light emitting surface of the light source comprises a curved surface, the light transmittance adjustment layer is located on the curved surface, and the electroactive layer is located at a bottom side of the curved surface and at a side of the package substrate far away from the light emitting element.

16. The light source according to claim 12,
wherein the light transmittance adjustment layer is connected with the electroactive layer, the first electrode and the second electrode are respectively connected with the electroactive layer, and the first electrode, the second electrode, the electroactive layer and the light transmittance adjustment layer are disposed in a same layer,
wherein a light-emitting surface of the light source comprises a planar surface, and the light transmittance adjustment layer is located on the planar surface.

17. A lighting device comprising the light source according to claim 1.

18. The lighting device according to claim 17, further comprising a driver circuit, wherein the lighting device comprises a plurality of light sources, and the driver circuit is configured to drive the plurality of light sources to obtain a pattern with variable-shape and/or a pattern with adjustable brightness.

19. A lighting device, comprising the light source according to claim 2, further comprising:
an ambient light sensor configured to sense a brightness of ambient light;
a memory; and
at least one processor,
wherein the ambient light sensor, the memory and the at least one processor are signally connected with each other,
wherein the memory is configured to store at least one calculation relationship of the following: a calculation relationship between the ambient light and a brightness of the light source required by a user, a calculation relationship between a brightness of the light source and light transmittance of the light transmittance adjustment layer, and a calculation relationship between light transmittance of the light transmittance adjustment layer and an amount of the deformation, a calculation relationship between an amount of the deformation of the light transmittance adjustment layer and an amount of the deformation of the electroactive layer, a calculation relationship between an amount of the deformation of the electroactive layer and an applied voltage,
wherein the memory is further configured to store an instruction being capable to be executed by a computer, and the instruction is configured to drive the at least one processor to execute the following steps:
converting an ambient light brightness being sensed into a voltage signal for forming the electric field; and
outputting the voltage signal to the light source for adjusting the brightness of the light source in real time.

* * * * *